United States Patent
Zhao et al.

(10) Patent No.: US 10,211,842 B2
(45) Date of Patent: Feb. 19, 2019

(54) QUANTIZATION NOISE CANCELLATION FOR FRACTIONAL-N PHASED-LOCKED LOOP

(71) Applicant: Apple Inc., Cupertino, CA (US)

(72) Inventors: Feng Zhao, San Jose, CA (US); Wei Deng, San Jose, CA (US); Dennis M. Fischette, Jr., Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/102,445

(22) Filed: Aug. 13, 2018

(65) Prior Publication Data

US 2018/0351561 A1    Dec. 6, 2018

Related U.S. Application Data

(63) Continuation of application No. 15/429,948, filed on Feb. 10, 2017, now Pat. No. 10,050,634.

(51) Int. Cl.
*H03L 7/06* (2006.01)
*H03L 7/091* (2006.01)
(Continued)

(52) U.S. Cl.
CPC ............ *H03L 7/091* (2013.01); *H03L 7/0891* (2013.01); *H03L 7/099* (2013.01); *H03L 7/1974* (2013.01)

(58) Field of Classification Search
USPC .................................. 327/147–149, 156–158
See application file for complete search history.

(56) References Cited

U.S. PATENT DOCUMENTS 5,821,816 A * 10/1998 Patterson ................ H03L 7/183
                                                                331/1 A
6,011,815 A *  1/2000 Eriksson .............. H03C 3/0925
                                                                332/107
(Continued)

FOREIGN PATENT DOCUMENTS

CN            102006065        4/2011

OTHER PUBLICATIONS

Jee, et al; "A FIR-Embedded Phase Interpolator Based Noise Filtering for Wide-Bandwidth Fractional-N PLL"; IEEE Journal of Solid-State Circuits, vol. 48, No. 11, Nov. 2013; pp. 2795-2804.
(Continued)

*Primary Examiner* — Adam Houston
(74) *Attorney, Agent, or Firm* — Meyertons, Hood, Kivlin, Kowert & Goetzel, P.C.

(57) ABSTRACT

A system includes an oscillator, a frequency divider, and a delay circuit. The oscillator may generate a clock signal using a reference signal. A frequency of the clock signal may be a non-integer multiple of a frequency of the reference signal. The frequency divider may generate a feedback signal using the clock signal and an adjustment factor based on the non-integer multiple. The delay circuit may select a particular delayed feedback signal from a plurality of delayed feedback signals based on a value of the adjustment factor. Each of the delayed feedback signals may be generated using periods of the clock signal. The delay circuit may also modify the particular delayed feedback signal using a portion of a period of the clock signal based on the adjustment factor. The oscillator may also adjust the frequency of the clock signal using the reference signal and the particular delayed feedback signal.

20 Claims, 7 Drawing Sheets

(51) Int. Cl.
*H03L 7/099* (2006.01)
*H03L 7/089* (2006.01)
*H03L 7/197* (2006.01)

(56) References Cited

U.S. PATENT DOCUMENTS

| | | | | |
|---|---|---|---|---|
| 6,047,029 A * | 4/2000 | Eriksson | H03C 3/0925 | 375/247 |
| 6,490,440 B1 * | 12/2002 | Mielke | H04B 1/0483 | 375/300 |
| 6,943,600 B2 | 9/2005 | Craninckx | | |
| 8,193,963 B2 * | 6/2012 | Wang | G04F 10/005 | 324/76.53 |
| 8,604,840 B2 * | 12/2013 | Ahmadi | H03L 7/1976 | 327/107 |
| 9,225,348 B2 * | 12/2015 | Ainspan | H03L 7/0992 | |
| 9,300,307 B2 * | 3/2016 | Juneau | H03L 7/18 | |
| 9,897,976 B2 * | 2/2018 | Gao | H03M 1/10 | |
| 9,979,405 B1 * | 5/2018 | Deng | H03L 7/081 | |
| 10,050,634 B1 * | 8/2018 | Zhao | H03L 7/091 | |
| 2007/0040940 A1 * | 2/2007 | Wang | H03L 7/087 | 348/536 |
| 2007/0159260 A1 * | 7/2007 | Beyer | H03L 7/081 | 331/10 |
| 2010/0183109 A1 * | 7/2010 | Lin | H03L 7/081 | 375/376 |
| 2011/0156783 A1 * | 6/2011 | Pavlovic | H03L 7/081 | 327/159 |
| 2012/0013375 A1 * | 1/2012 | Kuramochi | H03C 3/0925 | 327/156 |
| 2012/0313674 A1 * | 12/2012 | Malmcrona | H03K 23/425 | 327/117 |
| 2013/0033293 A1 * | 2/2013 | Zhang | H03L 7/1976 | 327/156 |
| 2013/0113530 A1 * | 5/2013 | Saint-Laurent | H03L 7/00 | 327/142 |
| 2013/0300477 A1 * | 11/2013 | Ueda | H03L 7/099 | 327/159 |
| 2014/0361817 A1 * | 12/2014 | Jovenin | H03L 7/08 | 327/156 |
| 2015/0070059 A1 * | 3/2015 | Suzuki | H03L 7/093 | 327/156 |
| 2015/0116016 A1 * | 4/2015 | Salleh | H03L 7/0891 | 327/157 |
| 2015/0229317 A1 * | 8/2015 | Juneau | H03L 7/18 | 327/105 |
| 2015/0280842 A1 * | 10/2015 | Mayer | H04B 17/21 | 375/316 |
| 2015/0349787 A1 * | 12/2015 | Keil | H03L 7/091 | 327/145 |
| 2016/0248431 A1 * | 8/2016 | Luo | G06F 1/04 | |
| 2016/0336923 A1 * | 11/2016 | Seedher | H03L 7/0891 | |
| 2017/0041005 A1 * | 2/2017 | Pandita | H03L 7/18 | |
| 2017/0093412 A1 * | 3/2017 | Van Brunt | H03L 7/091 | |
| 2017/0097613 A1 * | 4/2017 | Tertinek | H03L 7/085 | |
| 2017/0205772 A1 * | 7/2017 | Burg | H03L 7/091 | |
| 2017/0214408 A1 * | 7/2017 | Liang | H03L 7/099 | |
| 2017/0244544 A1 * | 8/2017 | Galton | H03L 7/093 | |
| 2017/0288686 A1 * | 10/2017 | Gao | H03L 7/091 | |
| 2017/0331483 A1 * | 11/2017 | Hossain | H03L 7/235 | |
| 2017/0346493 A1 * | 11/2017 | Markulic | H03K 5/159 | |
| 2017/0364034 A1 * | 12/2017 | Gao | H03M 1/10 | |
| 2017/0366376 A1 * | 12/2017 | Wang | H03L 7/093 | |
| 2018/0011142 A1 * | 1/2018 | Choo | H03L 7/091 | |
| 2018/0013455 A1 * | 1/2018 | Markulic | H04B 1/0475 | |
| 2018/0062660 A1 * | 3/2018 | van den Heuvel | H03L 7/087 | |
| 2018/0083642 A1 * | 3/2018 | Zerbe | H04L 7/0079 | |

OTHER PUBLICATIONS

Meninger, et al.; "A 1-MHZ Bandwidth 3.6-GHz 0.18-m CMOS Fractional-N Synthesizer Utilizing a Hybrid PFD/DAC Structure for Reduced Broadband Phase Noise"; IEEE Journal of Solid-State Circuits, vol. 41, No. 4, Apr. 2006; pp. 966-980.

\* cited by examiner

QUANTIZATION NOISE CANCELLATION FOR FRACTIONAL-N PHASED-LOCKED LOOP

The present application is a continuation of U.S. application Ser. No. 15/429,948, filed Feb. 10, 2017 (now U.S. Pat. No. 10,050,634); the disclosures of each of the above-referenced applications are incorporated by reference herein in their entireties.

BACKGROUND

Technical Field

Embodiments described herein are related to the field of integrated circuit implementation, and more particularly to the implementation of frequency synthesizer circuits.

Description of the Related Art

Systems-on-a-chip (SoCs) designs and wireless transceiver systems may include multiple frequency synthesizer clock generation modules, configured to output a clock signal at a target frequency or to modulate a carrier signal using frequency modulation (FM)/phase modulation (PM) encoding. Frequency synthesizer circuits may utilize a reference clock to generate output clock signals of a different frequency than the reference clock. In some embodiments, the target frequency may be programmable, allowing a processor in the SoC to adjust the clock frequency to an optimum value for current operating conditions, e.g., set a low frequency value to conserve power when fewer tasks are active, or vice versa. Some examples of such closed-loop clock generators include phase-locked loops (PLLs), delay-locked loops (DLLs), and frequency-locked loops (FLLs).

Some PLL circuits, referred to herein as fractional-N PLLs, generate a clock signal with a frequency that is a fractional multiple of a reference clock frequency, e.g., 3.5 times the reference clock frequency. This may be achieved by changing a divisor value in a feedback loop between two or more divisor values. In a fractional-N PLL, the switching between divisor values may cause quantization noise in the generated output clock signal.

SUMMARY OF THE EMBODIMENTS

Various embodiments of a clock generation unit are disclosed. Broadly speaking, a system, an apparatus, and a method are contemplated in which the system includes an oscillator circuit, a frequency divider circuit, and a delay circuit. The oscillator circuit may be configured to generate a clock signal whose frequency may vary in response to an input signal. A frequency of the clock signal may be a non-integer multiple of a frequency of a reference signal. The frequency divider circuit may be configured to generate a feedback signal using the clock signal and an adjustment factor that is based on the non-integer multiple. The delay circuit may be configured to select a particular delayed feedback signal from a plurality of delayed feedback signals based on a value of the adjustment factor. Each one of the plurality of delayed feedback signals may be generated using a number of periods of the clock signal. The delay circuit may also be configured to modify the particular delayed feedback signal using a portion of a period of the clock signal based on the adjustment factor. The oscillator circuit may be further configured to adjust the frequency of the clock signal using the reference signal and the particular delayed feedback signal.

In a further embodiment, to modify the particular delayed feedback signal, the delay circuit may be further configured to delay the particular delayed feedback signal by a portion of a period of the clock signal. The portion of the period may be based on an accumulated difference between the non-integer multiple and the value of the adjustment factor. In an embodiment, to select the particular delayed feedback signal from the plurality of delayed feedback signals, the delay circuit may be further configured to select the particular delayed feedback signal based on an accumulated difference between the non-integer multiple and the value of the adjustment factor.

In one embodiment, to generate the plurality of delayed feedback signals, the delay circuit may be further configured to delay each of the plurality of delayed feedback signals by a different number of periods of the clock signal. In an embodiment, the delay circuit may be further configured to calibrate the portion of the period of the clock signal.

In another embodiment, in response to a determination that a frequency lock has been asserted, the delay circuit may be further configured to calibrate the portion of the period of the clock signal using a binary search algorithm. In a further embodiment, the delay circuit is further configured to calibrate the portion of the period of the clock signal using a sequential search algorithm in response to a determination that the binary search algorithm has completed.

BRIEF DESCRIPTION OF THE DRAWINGS

The following detailed description makes reference to the accompanying drawings, which are now briefly described.

Figure 1:
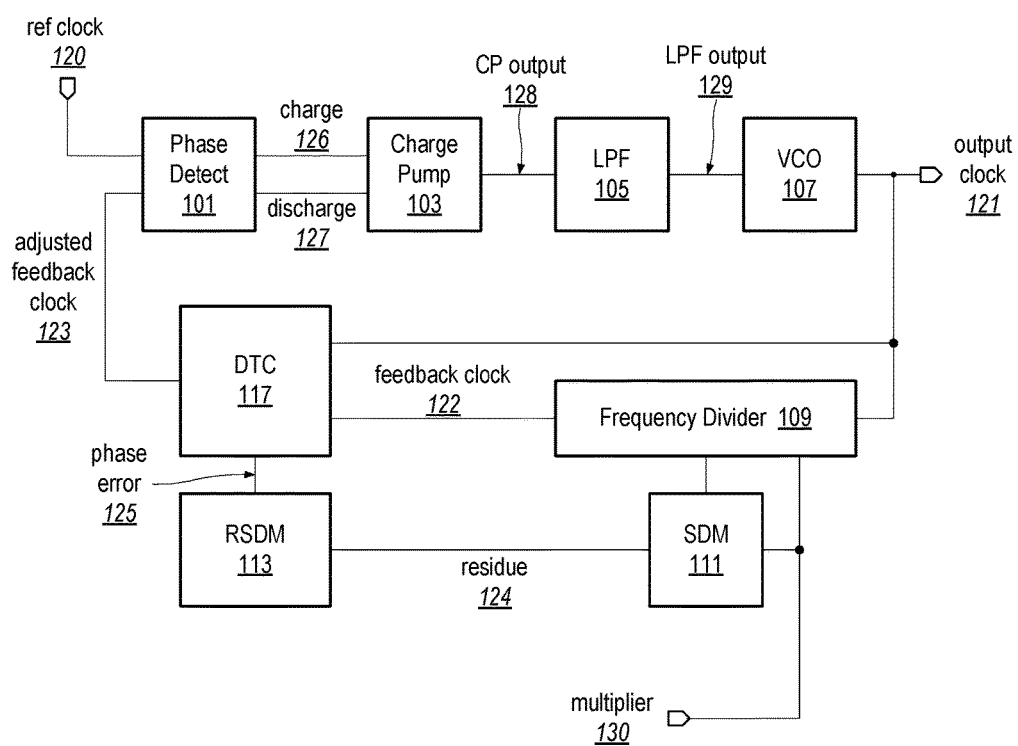
FIG. 1 illustrates a block diagram of an embodiment of a clock generation circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

In some integrated circuits (ICs), such as, e.g., a system-on-a-chip (SoC), a closed-loop clock generator may be used to generate high frequency clock signals that meet both accuracy and adjustability requirements of a given IC. A "closed-loop" clock generator, as used and described herein, refers to a clock generation circuit in which at least one parameter or condition of an output clock signal is fed back into the clock generation circuit and used to adjust the output clock signal to achieve and maintain target operating parameters of the clock signal, such as, the frequency of the output clock signal, for example. Generally speaking, a closed-loop clock generator in an IC may generate a clock signal and "lock" the clock signal at or near a target frequency. As used herein, to "lock" or "achieve lock" refers to a closed-loop clock generator generating a clock signal within a predetermined frequency range of a target (i.e., desired or selected) frequency.

Types of closed-loop clock generator circuits include fractional phase-locked loops (PLLs) in which a frequency of an output clock signal is based on a non-integer multiple of a reference clock signal, i.e., a fractional multiplier. A fractional PLL may generate a frequency of the output clock signal by switching among two or more integer multipliers such that the frequency of the output clock signal averages to a fractional multiplier over a period of time. The switching among two or more integer multipliers may cause a quantization error due to none of the integer multipliers matching the fractional multiplier at a given point in time. Quantization error may be caused by a switch between two integer multipliers resulting in a phase shift of a feedback signal (referred to herein as "phase error"), which, in turn, may cause jitter on the output clock signal.

The various embodiments illustrated in the drawings and described below may allow a clock generation circuit to compensate for quantization error when using a fractional multiplier. These embodiments may employ techniques that compensate for phase error, thereby reducing jitter of the output clock signal.

A block diagram of an embodiment of a clock generation circuit is illustrated in FIG. 1. Clock generation circuit 100 may represent a closed-loop clock generation circuit capable of generating an output clock signal at a frequency that is a fractional multiple of a frequency of a received reference clock, such as, for example, a fractional PLL circuit. In the illustrated embodiment, Clock Generation Circuit 100 includes Phase Detect 101 coupled to Charge Pump 103 via charge signal 126 and discharge signal 127. Charge Pump 103 is coupled to low pass filter (LPF) 105, which is, in turn, coupled to voltage controlled oscillator (VCO) 107, which is then coupled to Frequency Divider 109. Frequency Divider 109 is further coupled to Sigma-Delta Modulator (SDM) 111, which is further coupled to Residual Sigma-Delta Modulator (RSDM) 113. RSDM 113 is coupled to Digital-to-Time Converter (DTC) 117. Phase Detect 101 receives reference clock (ref clock) 120 and an output signal of DTC 117, adjusted feedback clock 123. Frequency Divider 109 and SDM 111 receive multiplier 130, which corresponds to a fractional multiplier used to determine a frequency of output clock 121.

Clock generation circuit 100 generates output clock 121 dependent upon ref clock 120. In one embodiment, clock generation circuit 100 is programmed to generate output clock 121 at a target frequency greater than the frequency of ref clock 120. Output clock 121 is generated by VCO 107. Phase Detect 101 receives adjusted feedback clock 123 and ref clock 120. Ref clock 120 may be generated by any suitable clock source, such as, e.g., a crystal oscillator circuit, configured to generate ref clock 120 at a known constant frequency with a desired level of accuracy.

Phase Detect 101 determines phase differences between ref clock 120, and adjusted feedback clock 123. In various embodiments, Phase Detect 101 may be referred to as a "phase detector" or "phase-frequency detector." In the illustrated embodiment, Phase Detect 101 generates two output signals. Charge signal 126 is asserted high when a rising transition (also referred to as a rising edge) occurs on ref clock 120. A length of time that charge signal 126 may remain asserted depends upon a time difference between the rising edge of ref clock 120 and a rising edge of adjusted feedback clock 123, i.e., a phase difference between ref clock 120 and adjusted feedback clock 123. Charge signal 126 is de-asserted after both adjusted feedback clock 123 and ref clock 120 are asserted.

In the illustrated embodiment, discharge signal 127 is asserted high when a rising edge on adjusted feedback clock 123 occurs. A length of time that discharge signal 127 may remain asserted depends upon a phase difference between adjusted feedback clock 123 and ref clock 120. Discharge signal 127 is de-asserted at a same time as charge signal 126, after both adjusted feedback clock 123 and ref clock 120 are asserted. Accordingly, when adjusted feedback signal 123 leads ref clock 120 (a rising transition of adjusted feedback signal 123 occurs before a corresponding rising transition of ref clock 120), then discharge signal 127 is asserted for a longer time than charge signal 126, and vice versa when ref clock 120 leads adjusted feedback 123.

Assertion of charge signal 126 causes Charge Pump 103 to increase a voltage level of CP output 128, which in turn, may cause a corresponding increase in a voltage level of LPF output 129. VCO 107, in the illustrated embodiment, increases the frequency of output clock 121 in response to an increased voltage level of LPF output 129. Conversely, VCO 107 decreases the frequency of output clock 121 in response to a decreased voltage level of LPF output 129. Assertion of discharge signal 127 causes an opposite result. Charge Pump 103 decreases the voltage level of CP output 128, leading to a decrease in the voltage level of LPF output 129 and, therefore, a reduction in the frequency of output clock 121.

If the rising edge of adjusted feedback clock 123 occurs after the rising edge of ref clock 120, then the frequency of output clock 121 may be lower than the target frequency and, therefore, need to be increased. Charge signal 126 remains asserted until after adjusted feedback clock 123 is asserted. The longer the time period between ref clock 120 asserting and adjusted feedback clock 123 asserting, the longer charge signal 126 remains asserted and, therefore, the more the frequency of output clock 121 may be increased. If the rising edge of adjusted feedback clock 123 occurs before the rising edge of ref clock 120, then the frequency of output clock 121 may be higher than the target frequency and, accordingly, need to be decreased. Discharge signal 127 asserts and remains asserted until after ref clock 120 is asserted. The farther ref clock 120 asserts after adjusted feedback clock 123, the longer discharge signal 127 remains asserted, and, therefore, the more that the frequency of output clock 121 is decreased.

Charge Pump 103 receives the charge signal 126 and discharge signal 127 from Phase Detect 101 and generates CP output 128 with a voltage level dependent upon the two outputs. When charge signal 126 is asserted, then Charge Pump 103 sources current into CP output 128. Conversely, when discharge signal 127 is asserted, then Charge Pump 103 draws or sinks current from CP output 128.

CP output signal 127 is received by LPF 105. LPF 105, in the illustrated embodiment, may include any suitable combination of circuit elements that allows signals with frequencies lower than a desired cutoff frequency to pass through to the output while attenuating signals with frequencies higher than the desired cutoff frequency. In various embodiments, LPF 105 may include only passive circuits elements such as capacitors and resistors. In other embodiments, LPR 105 may include active circuits elements, such as analog comparators or operational amplifiers (op-amps), in addition to passive components.

While the current of CP output 128 may change relatively quickly in response to changes in charge signal 126 and discharge signal 127, in the illustrated embodiment, a voltage level of the output of LPF 105, LPF output 129, changes more slowly in comparison to CP output 128. In response to changes in the current either sourced into or sunk from CP output 128, capacitors in LPF 105 may charge or discharge respectively. If both charge signal 126 and discharge signal 127 are de-asserted, the voltage level of CP output 128 may remain constant or drift higher or lower more slowly than when only charge signal 126 or discharge 127 is asserted.

Due to the slower response of LPF 105, for LPF output 129 to rise to a higher voltage level within a given time period, CP output 128 must remain at a higher voltage level for a majority of the given time period, and vice versa for the voltage level to fall to a lower voltage level. In other words, high frequency pulses with short durations are filtered out of LPF output 129. Accordingly, if charge signal 126 is asserted more often than discharge signal 127 (indicating that the frequency of output clock 121 is too low), CP output 128 may rise to a higher voltage level, thereby causing LPF output 129 to rise to a higher voltage level. On the other hand, if discharge signal 127 is asserted more frequently than charge signal 126 (indicating the frequency of output clock 121 is too high), then CP output 128 may fall to a lower voltage level, resulting in LPF output 129 falling to a lower voltage level.

LPF output 129 is sent to VCO 107 in the illustrated embodiment. VCO 107 generates output clock 121 at a frequency that is dependent upon the voltage level of LPF output signal 128. In one embodiment, a higher voltage level received by VCO 107 corresponds to a higher frequency of output clock 121 and to the contrary for lower voltage level of LPF output 228. In other embodiments, operation of VCO 107 may be reversed, e.g., a lower input voltage level results in a higher frequency, and vice versa. In such embodiments, the logic for generating charge signal 126 and discharge signal 127 may be reversed to suitably generate LPF output 129.

Frequency Divider 109 receives output clock 121 and generates feedback clock 122. Feedback clock 122, in the illustrated embodiment, is generated by Frequency Divider 109 by counting a number of periods of output clock 121 and then asserting feedback clock 122 upon a count value reaching a first threshold value. This first threshold value may be determined based on multiplier 130. Feedback clock 122 is de-asserted after the count value reaches a second threshold value. The time between each de-assertion of feedback clock 122 is referred to herein, as a "loop cycle" or "count cycle." At the end of a loop cycle, Frequency Divider 109 starts a new loop cycle and may continue repeating for as long Clock Generation Circuit 100 is enabled.

Feedback clock 122 is derived from output clock 121 dependent upon settings for Frequency Divider 109, including a divisor value based on multiplier 130. The divisor value may include select integer values within a predetermined range. Feedback clock 122 is generated with a frequency equal to the frequency of output clock 121 divided by the divisor value.

In order for the frequency of output clock 121 to achieve a fractional multiple of the frequency of ref clock 120, SDM 111, in the illustrated embodiment, adjusts the divisor value of Frequency Divider 109. For example, if multiplier 130 is equal to 9.4, corresponding to a desired frequency of output clock 121 to be 9.4 times higher than the frequency of ref clock 120, SDM 111 may adjust the divisor value of Frequency Divider 109 between nine and ten, such that forty percent of the periods of feedback clock 122 are generated with a divider value of ten and sixty percent are generated with a divider value of nine, thereby averaging out to a divisor value of 9.4. If, however, SDM 111 uses a repetitive pattern to alternate between divisor values of nine and ten, then output clock 121 may include undesirable characteristics such as harmonic noise corresponding to a frequency of the repetition of the pattern. SDM 111 may, therefore, use more divisor values than simply nine and ten, such as, for example, eight, nine, ten, and eleven. In addition, SDM 111 may alternate between these four divisor values without using a repeating pattern, or using a pattern that repeats infrequently enough to avoid significant harmonic noise from being generated. SDM 111 may adjust the divisor value every one or more loop cycles, dependent on the value of multiplier 130.

In addition to adjusting the divisor value of Frequency Divider 109, SDM 111 determines residue value 124 and sends this to RSDM 113. Residue value 124 corresponds to a difference between multiplier 130 and a current adjusted divider value. Continuing the previous example, residue value 124 may correspond to values of 1.4, 0.4, −0.6, or −1.6 based on a multiplier 130 of 9.4 and adjusted values of divider value of 8, 9, 10, or 11. A new residue value 124 may be generated and sent to RSDM 113 every one or more loop cycles. RSDM 113 converts this stream of received residue values 124 into an accumulated phase error signal 125.

In the illustrated embodiment, DTC 117 receives phase error signal 125 and uses this signal to generate adjusted feedback clock 123 from feedback clock 122. Phase error 125 corresponds to a number of periods of output clock 121 that the phase of feedback clock 122 may be ahead of or behind the phase of ref clock 120. Phase error 125 may include an integer and/or fractional values. DTC 117 delays propagation of feedback clock 122 by an amount of time based on phase error 125. The delayed feedback clock 122 corresponds to adjusted feedback clock 123. A more detailed embodiment of DTC 117 will be presented below.

Clock generation circuit 100, in the illustrated embodiment, is in a locked state once corresponding edges of ref clock 120 and adjusted feedback clock 123 occur within a predetermined amount of time of one another. Consequently, ref clock 120 and adjusted feedback clock 123 may not have exactly equal frequencies during the locked state. The predetermined amount of time, and, therefore, the accuracy of output clock 121, may be determined during design of clock generation circuit 100 to establish an acceptable level of accuracy for intended uses of output clock 121.

It is noted that the embodiment of clock generation circuit 100 as illustrated in FIG. 1 is merely an example. The illustration of FIG. 1 has been simplified to highlight features relevant to this disclosure. Various embodiments may include different configurations of the circuit bocks, including additional circuit blocks. Furthermore, although a PLL is used in the examples, the features described may apply to any suitable embodiment of a closed loop clock generation circuit, such as, a DLL, for example.

Figure 2:
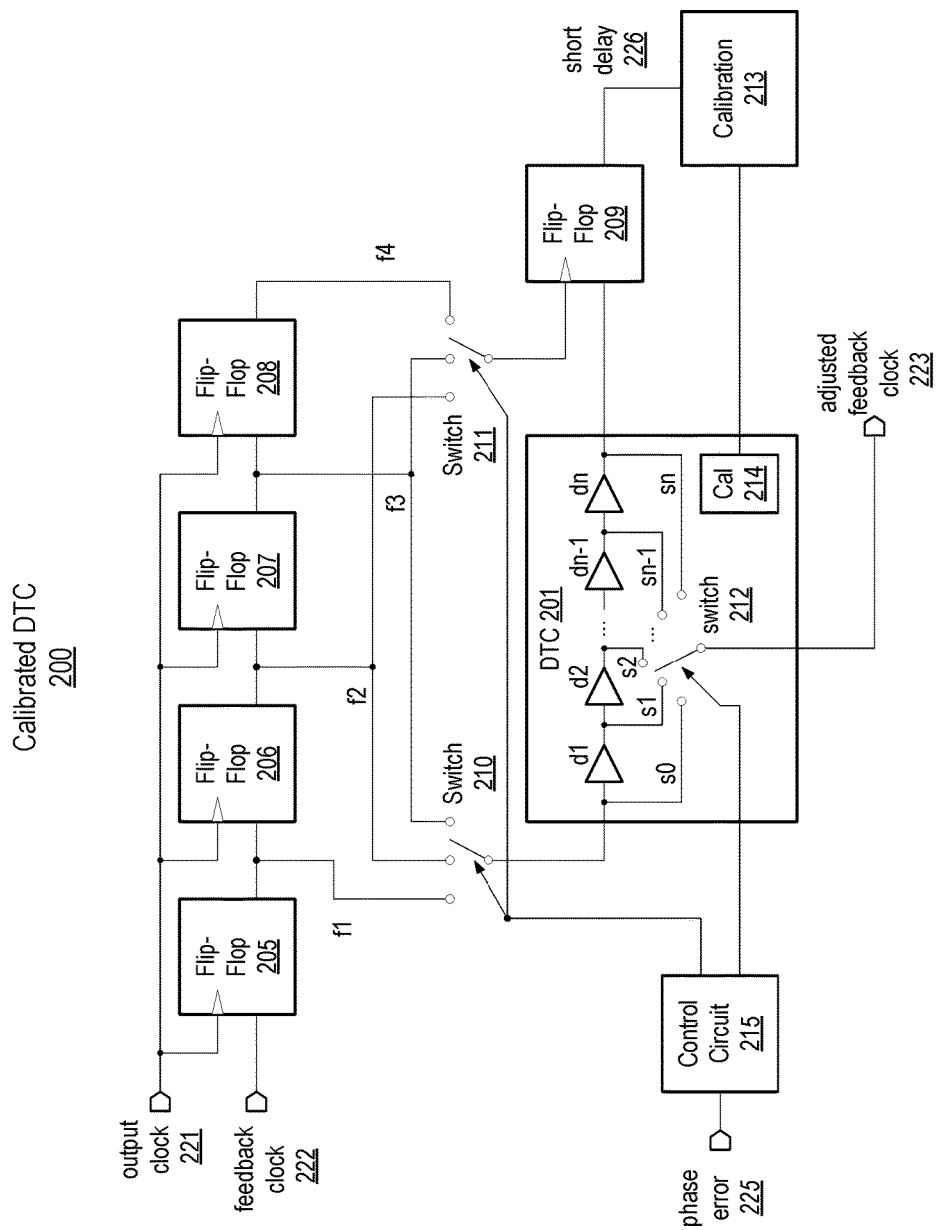
FIG. 2 depicts a block diagram of an embodiment of a digital-to-time converter (DTC) circuit with a calibration function.

Moving to FIG. 2 a block diagram of an embodiment of a calibrated digital-to-time converter circuit is depicted. Calibrated DTC 200 may correspond to an embodiment of DTC 117 in Clock Generation Circuit 100 of FIG. 1. In the illustrated embodiment, Calibrated DTC 200 includes DTC 201, Flip-Flops 205-209, switches 210 and 211, Calibration Circuit 213, and Control Circuit 215. In addition, DTC 201 includes delay elements d1 through dn, Switch 212, and calibration register (Cal) 214. Calibrated DTC 200 receives signals output clock 221, feedback clock 222 and phase error 225. Calibrated DTC 200 generates an output signal, adjusted feedback clock 223.

In the illustrated embodiment, output clock 221 is coupled to a clock input on each of Flip-Flops 205 through 208. Feedback clock 222 is coupled to a data input of Flip-Flop 205. Data inputs for each of Flip-Flops 206-208 are coupled in series subsequent to Flip-Flop 205, i.e., the output of Flip-Flop 205 is coupled to the input of Flip-Flop 206, etc. The outputs of Flip-Flops 205-208 are labeled f1 through f4, respectively. In response to a transition of feedback clock 222, outputs f1 through f4 each transition on a subsequent transition of output clock 221, such that f2 is delayed one clock period of output clock 221 from f1, f3 is delayed one clock period of output clock 221 from f2, and f4 is delayed one clock period from f3. Transitions of f4 are, therefore, delayed 3 periods of output clock 221 from transitions of f1.

Switches 210 and 211 are set by control circuit 215. Switch 210 is set to pass one of signals f1-f3, while Switch 211 is set to pass one of signals f2-f4. In the illustrated embodiment, Switch 211 is set to the same position as Switch 210 at a given time. For example, if Switch 210 is set to the middle position (coupled to signal f2), then Switch 211 is also set to the middle position (coupled to signal f3). The output of Switch 211 is, therefore, delayed one period of output clock 221 from the output of Switch 210 (labeled s0). Signal s0 is received by DTC 201 at an input to delay element d1. Delay elements d1-dn are, similar to Flip-Flops 205-208, coupled in series with the output of delay element d1 coupled to the input of delay element d2, and so forth. Delay element dn is the final element in the series, with output signal, sn, coupled to a data input of Flip-Flop 209. The delay time from a transition on signal s0 to a corresponding transition on signal sn is approximately one period of output clock 221 when DTC 201 is calibrated.

Control Circuit 215 sets Switch 212 to select one of signals s0 through sn to use as adjusted feedback clock 223. Signal s0 adds no additional delay from the output of Switch 210, whereas signal sn delays the output of Switch 210 by one additional period of output clock 221 to generate adjusted feedback clock 223. Selecting one of signals s1 through sn−1 delays adjusted feedback clock 223 by an additional portion of a period of output clock 221, with signal s1 adding a smallest portion and signal sn−1 adding a largest portion of a period of output clock 221. Utilizing switches 210 and 212, adjusted feedback clock 223 may be delayed from feedback clock 222 by one period of output clock 221 when Switch 210 is set to select signal f1 and Switch 212 is set to select signal s0. Adjusted feedback clock 223 may also be delayed from feedback clock 222 by four periods of output clock 221 when Switch 210 is set to select signal f3 and Switch 212 is set to select signal sn. Delay times between one and four periods, including portions of a period, may be selected using other settings for switches 210 and 212. Any suitable number of delay elements may be used, with higher numbers resulting in more resolution when selecting a portion of a period of output clock 221.

The delay times for each of delay elements d1-dn may deviate in response to changes in operating voltage and operating temperature while Calibrated DTC 200 is in operation. Furthermore, delay times for elements d1-dn may also deviate from chip-to-chip due to semiconductor processing variations during manufacturing. To compensate for these deviations, calibration circuitry is included to compare a delay time from signal s0 to signal sn to one period of output clock 221. In the illustrated embodiment, Control Circuit 215 sets the output of Switch 211 to select the one of the signals f2-f4 that is one period delayed from the signal selected by Switch 210. When Switch 210, therefore, is set to select signal f1, Switch 211 is set to select switch f2. Likewise, when Switch 210 selects signal f2, Switch 211 selects signal f3 and when Switch 210 selects signal f3, Switch 211 selects signal f4. The clock input to Flip-Flop 209, therefore, transitions one period of output clock 221 later than signal s0 (the output of Switch 210). When the delay through delay elements d1-dn is less than one period of output clock 221, then the output of delay element dn transitions high before the output of Switch 211, and Flip-Flop 209 latches a logic high value that is generated as an output, short delay 226. In contrast, when the delay through delay elements d1-dn is greater than one period of output clock 221, then the output of delay element dn transitions high after the output of Switch 211, and short delay 226 is latched as a logic low value.

Calibration Circuit 213 generates a calibration value that is sent to calibration register (Cal) 214 of DTC 201. The calibration value in Cal 214 is used to calibrate or "trim" delay times for each of delay elements d1 through dn. As used herein, to "trim," or "trimming" refers to a process of calibrating an adjustable delay element to achieve a desired delay time through the delay element. Additional details of an embodiment of an adjustable DTC will be presented later in the disclosure.

In the illustrated embodiment, Calibration Circuit 213 generates a default calibration value upon initialization of Calibrated DTC 200. Based on the state of short delay 226, Calibration Circuit 213 adjusts the calibration value. In some embodiments, an increase in the calibration value will increase a delay time for each of delay elements d1-dn, and vice versa in other embodiments. A logic high on short delay 226 may cause Calibration Circuit 213 to adjust the calibration value to increase the delay time of the delay elements, and a logic low on short delay 226 causes a corresponding decrease in the delay time of the delay elements. Various algorithms may be employed to adjust the calibration value. For example, a binary search algorithm may be used in which the calibration value is adjusted half-way between a current value and one of two threshold values based on a current state of short delay 226. In other embodiments, a linear or sequential algorithm may be used in which the calibration value is incremented or decremented by a predetermined value based on the current state of short delay 226. In the illustrated embodiment, both binary and sequential algorithms are employed at different times. Upon an initialization of Calibrated DTC 200, the binary algorithm is used, which may result in a faster time t0 calibrating DTC 201. Once the initial calibration is complete, Calibration Circuit 213 uses the sequential algorithm to adjust delay elements d1-dn to compensate for changes in voltage or temperature during ongoing operation of Calibrated DTC 200.

It is noted that Flip-Flops 205-209 are illustrated as rising-edge active circuits. Herein, "rising-edge active" refers to a flip-flop circuit that latches a state of its respective input in response to a rising transition of its respective clock input. In other embodiments, some or all of Flip-Flops 205-209 may be implemented as falling-edge active circuits that latch a state of their respective input in response to a falling transition of their respective clock input.

It is also noted that the embodiment of FIG. 2 is merely one example of a calibrated DTC. Calibrated DTC 200 has been simplified to focus on features relevant to this disclosure. In other embodiments, additional circuit blocks may be included. Circuit blocks may also be configured differently in some embodiments.

Figure 3:
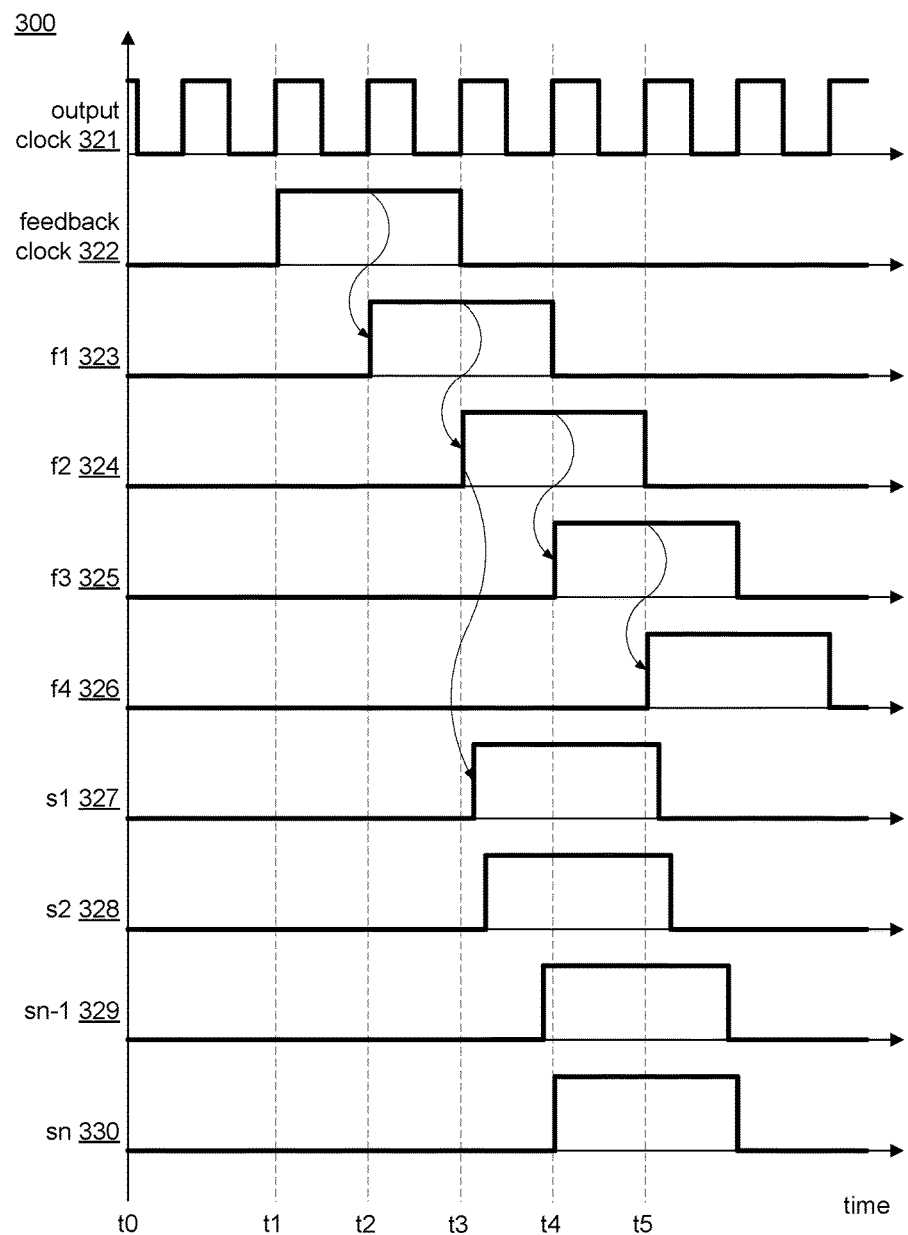
FIG. 3 shows a timing diagram illustrating possible waveforms corresponding to an embodiment of a calibrated DTC circuit.

Turning to FIG. 3, a timing diagram illustrating possible waveforms of an embodiment of a frequency divider circuit is shown. The waveforms of timing diagram 300 illustrate logic levels versus time for various signals shown in FIG. 2. Referring collectively to FIG. 2 and FIG. 3, timing diagram 300 includes waveforms output clock 321 and feedback clock 322, corresponding, in the illustrated embodiment, to the similarly named and numbered signals in FIG. 2. In addition, output signals from each of Flip-Flops 205-208 are shown, labeled f1 323 through f4 326. Output signals from each of delay elements d1-dn, labeled s1 327 through sn 330 are also included in timing diagram 300.

At time t0, all signals are low. At time t1, feedback clock 322 transitions high. In the illustrated embodiment, feedback clock 322 remains high for two cycles of output clock 321. In other embodiments, feedback clock 322 may remain high for any suitable number of cycles of output clock 321. Signal f1 323 transitions high, at time t2, based on a rising transition on output clock 321 with feedback clock 322 at a high level, highlighted by an arrow. Similarly, signal f2 324 transitions high at time t3 in response to another rising edge on output clock 321 with signal f1 323 at a high level. Signals f3 325 and f4 326, in a similar manner, transition high, respectively, at times t4 and t5 due to successive rising transitions of output clock 321, while signals f2 324 and f3 325, respectively, are high.

Signals s1 327 through sn 330 are based on a selected one of signal f1 323 through f4 326. In the illustrated example, signal f2 324 is selected based on a setting of Switch 210. The output of delay element d1, signal s1 327, rises high, in response to the rising transition of signal f2 324 at time t3. The rising transition of signal s1 327 is delayed from the rising transition of signal f2 324 by a delay time that is a portion of a clock period of output clock 321. Each subsequent delay element d2 through dn in DTC 201 delays a respective rising transition of its output, s2 328 through sn 330, by an additional portion of a clock period of output clock 321. The rising transition of signal sn 330, when DTC 201 is calibrated, occurs one period of output clock 321 after the rising edge of signal f2 324, or, in other words, at a same time as signal f3 325. To calibrate DTC 201, therefore, signal sn 330 may be compared to signal f3 325 via Switch 211, when signal f2 324 is selected by Switch 210.

Adjusted feedback clock 223 corresponds to the output of Switch 212, which, in turn is based on the output of Switch 211. Switch 211 may be selected based on an integer portion of phase error 125 in FIG. 1, while Switch 212 may be set based on a fractional portion of phase error 125. As described, Switch 211 is set to select signal f2 324 in timing diagram 300. An additional fractional delay may be added by selecting one of signals s1 327 through sn 330. A number of delay elements d1 through dn may be included in DTC 201 based on a desired resolution for the fractional portion of the delay. If a fractional portion of phase error 125 is less than the delay associated with signal s1 327, then Switch 212 may be set to select signal s0 (not shown in FIG. 3), which is the output of Switch 211 without additional delay time.

Switches 210, 211, and 212 may have default settings to correspond to a phase delay of zero. For example, a phase delay of zero may correspond to Switch 211 set to signal f3 325, Switch 211 set to signal f4 326, and Switch 212 set to signal s0 (no additional delay). In this example, DTC 201 may be used to change the delay time of adjusted feedback clock from minus two periods of output clock 321 (Switch 210 set to signal f1 323 and Switch 212 set to signal s0) to plus one period of output clock 321 (Switch 211 set to signal f3 325 and Switch 212 set to signal sn 330). In other embodiments, other settings of switches 210-212 may be used to correspond to a phase error of zero.

It is noted that timing diagram 300 of FIG. 3 merely illustrates an example of signals resulting from one embodiment of Calibrated DTC 200. The signals are simplified to provide clear descriptions of the disclosed concepts. In various embodiments, the signals may appear different due various influences such as technology choices for building the circuits, actual circuit design and layout, ambient noise in the environment, choice of power supplies, etc. In addition, rise and fall times of various signals may be longer than illustrated, as well as delays between rising transitions of the various signals, in various embodiments.

Figure 4:
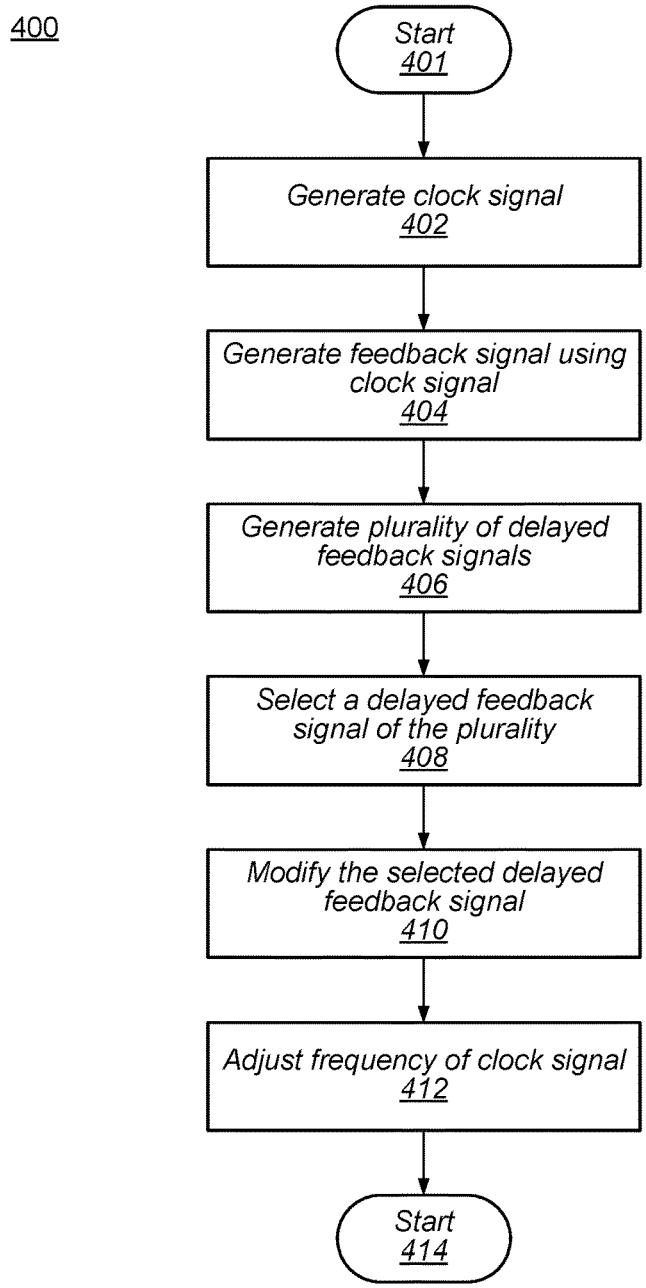
FIG. 4 illustrates a flow diagram of an embodiment of a method for operating a closed-loop clock generation circuit.

Moving now to FIG. 4 a flow diagram depicting an embodiment of a method for operating a closed-loop clock generation circuit is illustrated. The method may be applied to a clock generation circuit, such as, for example, Clock Generation Circuit 100 in FIG. 1, including a digital-to-time converter circuit such as, e.g., Calibrated DTC 200. Referring collectively to Clock Generation Circuit 100, Calibrated DTC 200 and Method 400 in FIG. 4, the method may begin in block 401.

A clock signal is generated (block 402). A clock generation circuit, such as Clock Generation Circuit 100, for example, generates a clock signal via VCO 107. In the illustrated embodiment, VCO 107 generates output clock 121 based on a voltage level of LPF output 129. A frequency of output clock 121 is determined by reference clock 120 and multiplier 130. A value of multiplier 130 may be between two consecutive integer values, i.e., a fractional multiplier value.

A feedback signal is generated using the clock signal (block 404). A feedback signal, e.g., feedback clock 122, is generated by Frequency Divider 109 using output clock 121 as an input signal. Frequency Divider 109 generates feedback clock 122 at a frequency based on multiplier 130 and an adjustment determined by SDM 111. SDM 111, in the illustrated embodiment, by adding one or two, or subtracting one, from the value of multiplier 130. In some embodiments, SDM 111 receives multiplier 130 and sends an integer value to Frequency Divider 109, including the adjustment. In other embodiments, Frequency Divider 109 may receive the adjustment from SDM 111 separate from multiplier 130.

A plurality of delayed feedback signals are generated based on the feedback signal (block 406). DTC 117 receives both output clock 121 and feedback clock 122. DTC 117, in the illustrated embodiment, corresponds to Calibrated DTC 200. Calibrate DTC 200 generates four delayed feedback signals based on feedback clock 222 and output clock 221, labeled f1 through f4 in FIG. 2. Each of signals f1-f4 are delayed by one period of output clock 221 from its respective input signal. Signal f1, therefore, is delayed by one period from feedback clock 222, signal f2 is delayed by two periods from feedback clock 222, signal f3 is delayed from feedback clock 222 by three periods, and subsequently, signal f4 is delayed by four periods of output clock 221 from feedback clock 222.

One of the plurality of delayed feedback signals is selected (block 408). One of signals f1 through f3 is selected by Control Circuit 215 using Switch 210. The selection, in the illustrated embodiment, is made based on an integer portion of phase error 225. The value of phase error 225 may be a positive or negative real number. In various embodiments, the integer portion of the value of phase error 225 may be determined by truncating the fractional portion of the value, by rounding to a closest integer value, by rounding to a next lower value, or by rounding to a next higher value. In the illustrated embodiment, the integer portion is determined by rounding to the next higher integer value.

As described above, a particular signal of signals f1-f3 may be selected when phase error 225 is zero, for example, signal f3 for the illustrated embodiment. In response to a positive integer value of phase error 225, Control Circuit 215 selects signal f1 or signal f2. Signal f2 may be selected if the integer value of phase error 225 is one and signal f1 selected if the integer value of phase error 225 is 2 or higher. If the integer value of phase error 225 is negative, then signal f3 is selected. In addition, Switch 211 is set to a same position as Switch 210, thereby selecting a subsequent signal of signals f2-f4. For example, if Switch 210 is set to the middle position to select signal f2, the Switch 211 is also set to the middle position to select signal f3, the signal that is one period of output clock 221 later than signal f2.

A delay time of the selected delayed feedback signal is modified (block 410). One of signals s0-sn in DTC 201 is selected by Control Circuit 215 using Switch 212. The selection may be based on a fractional portion of the value of phase error 225. In the illustrated embodiment, the fractional portion of the value of phase error is determined by subtracting the rounded higher integer value from the value of phase error 225. For example, a phase error 225 of 0.7 may result in an integer value of 1 and a fractional portion of 0.3. As another example, if phase error 225 is −0.4, then the integer value may be rounded to zero and the fractional portion set to 0.4.

When phase error 225 is zero, signal s0 may be selected, in the illustrated embodiment, which corresponds to the selected signal of signals f1-f3, with no additional delay. When DTC 201 is calibrated, each of signals s0-sn may add a similar amount of delay time t0 the selected signal received from Switch 210. For example, if DTC 201 includes five delay elements, d1-d5, then signal s1 may add 0.2 (20%) of the period of output clock 221 to the output of Switch 210. Each of signals s2-s5 may add an additional 0.2 of the period of output clock 221 to the output of Switch 210. In such an embodiment, if the fractional portion is 0.57, then Switch 212 may be set to select s3 to add 0.6, the closest delay value, of the period to the output of Switch 210 to generate adjusted feedback clock 223.

As an example of setting both the integer and fractional portions, if the value of phase error 225 is 1.61, then the integer portion is set to 2 and the fractional portion set to 0.39. Switch 210, in this case, may be set to select signal f1 and Switch 212 set to select signal s2, for a total delay time of 1.4 times the period of output clock 221. As stated, a value of zero for phase error 225 results in signals f3 and s0 being selected by switches 210 and 211, and this zero error value results in adjusted feedback clock being delayed by three periods of output clock 221 from feedback clock 222. The value of 1.61 for phase error 225 results in adjusted feedback clock being delayed by 1.4 periods of output clock 221 from feedback clock 222, i.e., an adjustment of 1.6 periods.

The frequency of the clock signal is adjusted (block 412). Adjusted feedback clock 123, corresponding to adjusted feedback clock 223 in FIG. 2, is received by Phase Detect 101. As previously described in regards to FIG. 1, Phase Detect 101 generates signals charge 126 and discharge 127 based on a comparison of reference clock 120 and adjusted feedback clock 123. Charge pump 103 generates CP output signal 128 based on the states of signals charge 126 and discharge 127. The voltage level of CP output signal 128 is filtered through LPF 129, generating LPF output signal 129. VCO 107 adjusts the frequency of output clock 121 based on the voltage level of LPF output signal 129. The method ends in block 414.

It is noted that the method illustrated in FIG. 4 is merely an example. In other embodiments, variations of this method are contemplated. Some operations may be performed in a different sequence, and/or additional operations may be included. In some embodiments, some operations may occur in parallel. Although an example of five delay elements, d1-d5, was disclosed, any suitable number of delay elements may be used in other embodiments.

Figure 5:
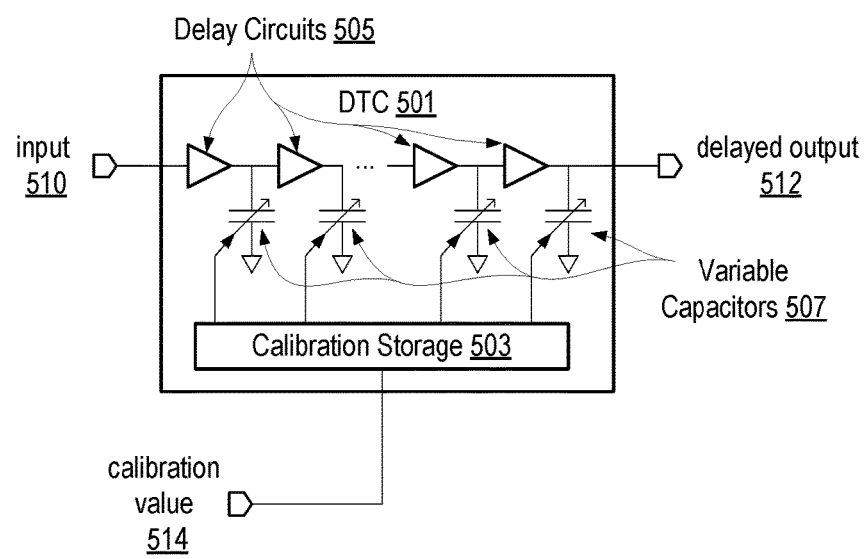
FIG. 5 shows a block diagram of an embodiment of a trimmable DTC circuit.

Turning now to FIG. 5, a block diagram of an embodiment of a trimmable DTC circuit is shown. DTC 501 includes Delay Circuits 505, variable capacitors 507, and calibration values 503. DTC 501 receives input signal 510 and calibration value 514, and generates delayed output signal 512. In some embodiments, DTC 501 may correspond to DTC 201 in FIG. 2.

DTC 501 is an example embodiment of a trimmable DTC circuit. As used herein, "trimmable" refers to a circuit in which one or more circuit elements may be adjusted to select or trim one or more parameters of the circuit to produce a desired result from the circuit. DTC 501 includes Variable Capacitors 507, which may be tuned to vary an amount of capacitance across each one. In some embodiments, such as, for example, an integrated circuit, each of Variable Capacitors 507 may include two or more capacitive elements, with each capacitive element being selectively coupled to the nodes of a particular Variable Capacitor 507. The selected capacitive element(s) may determine an amount of capacitance for the particular Variable Capacitor 507.

Each of Variable Capacitors 507, in the illustrated embodiment, may contribute to a delay time of a respective one of Delay Circuits 505. By adjusting the amount of capacitance across one or more of Variable Capacitors 507, the delay time through each of Delay Circuits 505, and therefore, a total delay time from a transition on input signal 510 to a corresponding transition on delayed output0 signal 512 may be set. Calibration Storage 503 may correspond to register bits or other type of memory for storing values that determine the amount of capacitance in each of Variable Capacitors 507. The values stored in Calibration Storage 503 may be received via calibration value 514. In some embodiments, each of Variable Capacitors 507 may have a respective value in Calibration Storage 503 such that the delay time for each of Delay Circuits 505 may be adjusted independently. In other embodiments, Calibration Storage 503 may include a single value that is used to set the amount of capacitance for each of Variable Capacitors 507.

Each of Delay Circuits 505 may use any suitable type of delay circuit. In some embodiments, Delay Circuits 505 may correspond to resistor-capacitor circuits in which a time constant based on a resistance and a capacitance of the circuit determine the delay time through the circuit. In such circuits, each of Variable Capacitors 507 may provide some or all of the capacitance for a respective circuit. In other embodiments, each of Delay Circuits 505 may correspond to a stacked inverter or stacked buffer circuit in which a delay time is determined by propagation delays through an inverter or buffer circuit. In such embodiments, each of Variable Capacitors 507 may provide an additional delay to an output of a respective Delay Circuit 505, or may contribute to a propagation delay through each respective Delay Circuit 505. In some embodiments, circuit elements other than Variable Capacitors 507 may be utilized.

It is noted that FIG. 5 is an example of a trimmable DTC circuit. Some circuit elements of DTC 501 have been omitted from FIG. 5 for clarity. In other embodiments, additional circuit elements, such as, for example, a switch to select an output from one of Delay Circuits 505, may be included in other embodiments.

Figure 6:
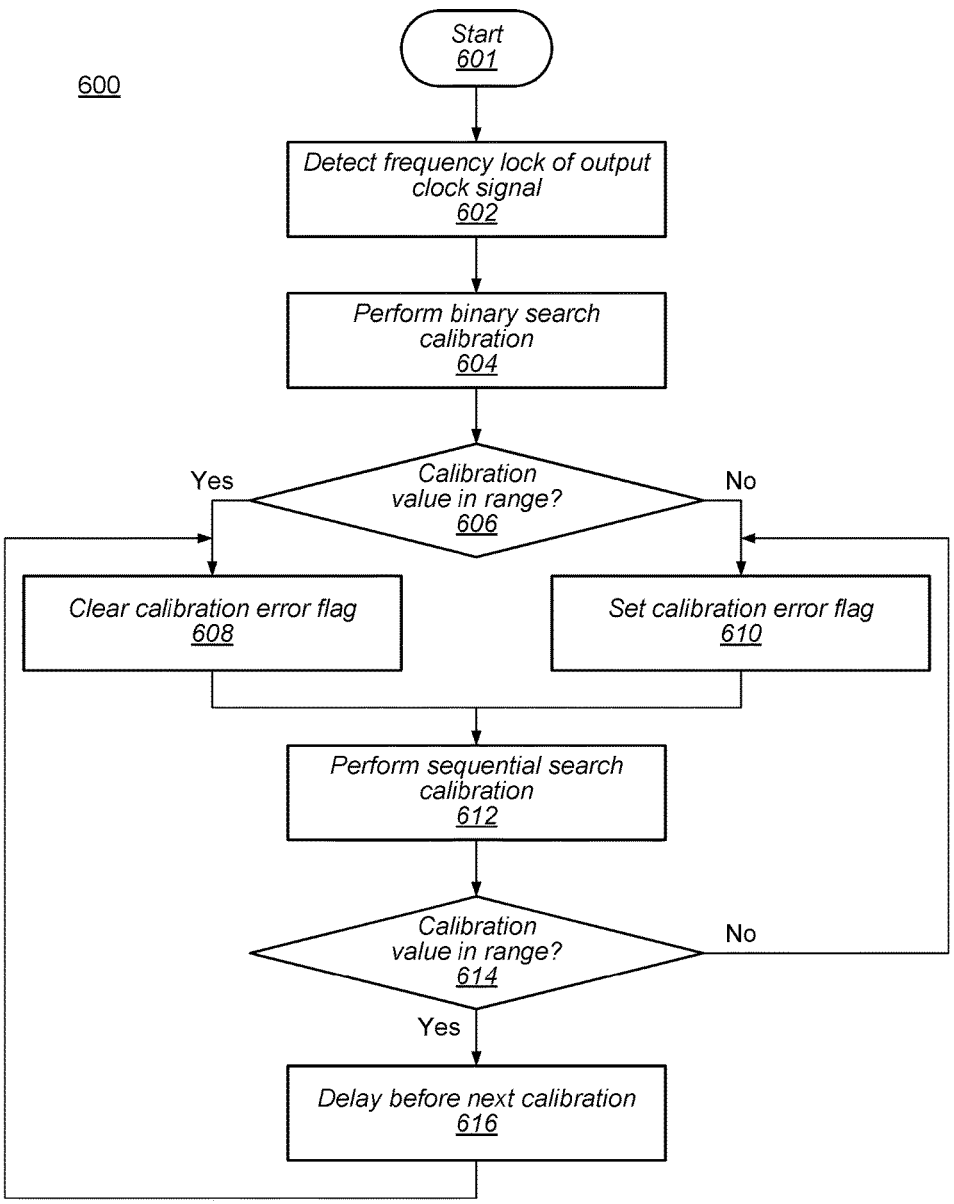
FIG. 6 depicts a flow diagram of an embodiment of a method for calibrating a DTC circuit.

Moving to FIG. 6, a flow diagram of an embodiment of a method for calibrating a DTC circuit is depicted. The method may be applied to a calibrated DTC circuit, such as, for example, Calibrated DTC 200 in FIG. 2. Referring collectively to Calibrated DTC 200 and Method 600 in FIG. 6, the method may begin in block 601.

An assertion of a frequency lock is detected (block 602). In response to a clock generation circuit, such as, for example, Clock Generation Circuit 100 in FIG. 1, being enabled, a power signal and/or an enable signal coupled to Calibrated DTC 200 may be asserted. In the illustrated embodiment, a frequency lock signal is asserted after a frequency of output clock 221 approaches close to a target frequency. In the illustrated embodiment, upon detecting the frequency lock, Control Circuit 215 begins a DTC calibration process. Calibrated DTC 200 enters an initial state in which one or more operating parameters are set to a default value. In other embodiments, operating parameters may return to previous or last used values, if available.

A calibration is performed using a binary search technique (block 604). As part of the initial state of Calibrated DTC 200, Calibration Circuit 213, in the illustrated embodiment, defaults to a binary search algorithm. Using the binary search algorithm, Calibration Circuit 213 searches for a suitable calibration value for DTC 201 by sending a calibration value to Calibration Register 214 that is in the middle of the range of possible calibration values. In the illustrated embodiment, a higher calibration value results in a shorter delay time, and vice versa. In other embodiments, the opposite may be valid. If the resulting delay time through DTC 201 is shorter than desired, then Calibration Circuit 213 sends a value that is halfway between the current calibration value and the lowest possible calibration value. Otherwise, if the resulting delay time is too long, then Calibration Circuit 213 sends a value that is halfway between the current calibration value and the highest possible calibration value. The process repeats for a predetermined number of calibration values, each time selecting a new calibration value that is either between the current value and one of the extreme values (highest or lowest) or between the current value and a previous value. After the predetermined number of tries has been completed, the method moves to block 606.

Further operations of Method 600 may depend on the resulting calibration value (block 606). In some embodiments, certain calibration values may be regarded as out of range. Calibration values that are close to either the highest or lowest possible calibration values may be determined to be out of range. For example, if the calibration value is comprised of eight data bits, then 0 is the lowest value and 255 is the highest value. Calibration Circuit 213 may determine that the range of valid calibration values is 20-234. Limiting the range of valid calibration values may be done to provide some adjustment space if the delay time of DTC 201 drifts during operation. If the resulting calibration value is in range, then the method moves to block 608 to clear a calibration error flag. Otherwise, the method moves to block 610 to set the calibration error flag.

If the resulting calibration value is within range, then the calibration flag is cleared (block 608). After completing the binary search with a valid calibration value, the calibration error flag may already be clear. If, however, the calibration flag has been set due to a previous generation of an out of range calibration value, then the calibration flag is cleared. In the illustrated embodiment, clearing the calibration flag corresponds to setting a register bit and/or a signal node to a logic low value. In other embodiments, the polarity may be reversed and a clear calibration flag may correspond to a high value. Although a valid calibration value has been determined, the method continues in block 612 to perform a sequential search technique that may compensate for changes to the calibration value due to drift of the delay time of DTC 201 during operation.

If the resulting calibration value is out of range, then the calibration flag is set (block 610). Setting the calibration flag, in the illustrated embodiment, corresponds to setting a register bit and/or asserting a signal node to a logic high value. In some embodiments, setting the calibration flag may trigger an interrupt signal or exception signal to circuitry external to Calibrated DTC 200. The method continues in block 612 to attempt to find a valid calibration value using a sequential search technique.

A calibration is performed using a sequential search technique (block 612). A sequential search technique is performed by starting with a particular calibration value and then either incrementing or decrementing the current calibration value by one depending on if the resulting delay time in DTC 201 is too long or too short, respectively. Calibration Circuit 213 may increment or decrement the calibration value one or more times before moving to the next operation.

Subsequent operations of method 600 may depend on the current calibration value (block 614). The calibration value determined by the sequential search is compared to one or more thresholds used to define upper and lower limits of the valid range of calibration values. If the current calibration value is valid, then the method moves to block 616 to wait for a period of time. Otherwise, the method moves back to block 610 to set the calibration error flag.

The method delays for an amount of time before performing a next calibration (block 616). To get to this point, the calibration value currently has a valid value. In some embodiments, Calibration Circuit 213 may wait for a particular amount of time. The amount of time may correspond to any suitable amount of time. For example, the amount of time for the delay may correspond to one or more periods of output clock 221 or feedback clock 222. In some embodiments, the amount of the delay time may be determined by one or more delay circuits similar to delay elements d1-dn in DTC 201. In other embodiments, this operation may be omitted and the method may proceed without added delay time. The method returns to block 608 to clear the calibration flag (if set) and then perform another sequential search. Method 600 may continue to operate for as long as the frequency lock signal is asserted.

It is noted that the method illustrated in FIG. 6 is an example to demonstrate the disclosed concepts. In other embodiments, additional operations may be performed and/or operations may be performed in a different sequence. In some embodiments, some operations may occur in parallel.

Figure 7:
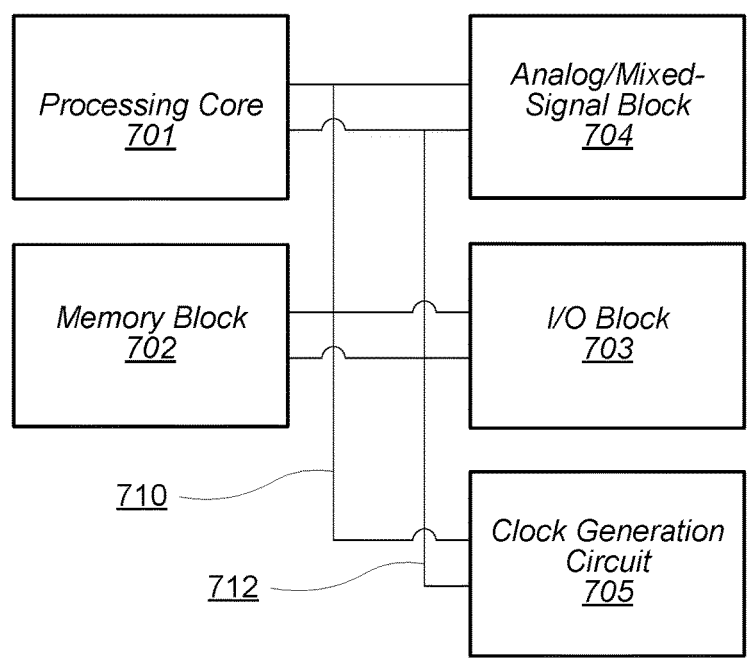
FIG. 7 illustrates an embodiment of an integrated circuit (IC) including various circuit blocks coupled to a clock generation circuit.

Turning now to FIG. 7, a block diagram of an embodiment of an integrated circuit (IC) is illustrated. IC 700 may include a clock generation circuit, such as, for example, Clock Generation Circuit 100 in FIG. 1. In the illustrated embodiment, IC 700 includes Processing Core 701 coupled to Memory Block 702, I/O Block 703, Analog/Mixed-Signal Block 704, Clock Generation Circuit 705, all coupled through bus 190. Additionally, Clock Generation Circuit 705 provides a clock signal 712 to the circuit blocks in IC 700. In various embodiments, IC 700 may correspond to a system on a chip (SoC) for use in a mobile computing application such as, e.g., a tablet computer, smartphone or wearable device.

Processing Core 701 may, in various embodiments, be representative of a general-purpose processor that performs computational operations. For example, Processing Core 701 may be a central processing unit (CPU) such as a microprocessor, a microcontroller, an application-specific integrated circuit (ASIC), or a field-programmable gate array (FPGA). In some embodiments, Processing Core 701 may include multiple CPU cores and may include one or more register files and memories. In various embodiments, Processing Core 701 may implement any suitable instruction set architecture (ISA), such as, e.g., PowerPC™, or x86 ISAs, or combination thereof. Processing Core 701 may include one or more bus transceiver units that allow Processing Core 701 to communication to other functional circuits via bus 190, such as, Memory Block 702, for example.

Memory Block 702 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM), for example. Some embodiments may include a single memory, such as Memory Block 702 and other embodiments may include more than two memory blocks (not shown). In some embodiments, Memory Block 702 may be configured to store program instructions that may be executed by Processing Core 701. Memory Block 702 may be configured to store data to be processed, such as graphics data, for example. Memory Block 702, may, in some embodiments, include a memory controller for interfacing to memory external to IC 700, such as, for example, one or more DRAM chips.

I/O Block 703 is, in one embodiment, configured to coordinate data transfer between IC 700 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. I/O Block 703 may include general-purpose input/output pins (I/O pins). In some embodiments, I/O Block 703 may be configured to implement a version of Universal Serial Bus (USB) protocol, IEEE 1394 (Firewire®) protocol, or an Ethernet (IEEE 802.3) networking standard.

In the illustrated embodiment, Analog/Mixed-Signal Block 704 includes one or more analog circuits. For example Analog/Mixed-Signal Block 704 may include a crystal oscillator, an internal oscillator, a PLL, a DLL, and/or an FLL. One or more analog-to-digital converters (ADCs) or digital-to-analog converters (DACs) may also be included in Analog/Mixed-Signal Block 704. In some embodiments, Analog/Mixed-Signal Block 704 may include radio frequency (RF) circuits that may be configured for operation with cellular telephone networks, or other suitable RF-based networks. Analog/Mixed-Signal Block 704 may include one or more voltage regulators to supply one or more voltages to various functional circuits and circuits within those blocks.

Clock Generation Circuit 705 may be configured to initialize and manage outputs of one or more clock sources. In various embodiments, the clock sources may be located in Analog/Mixed-Signal Block 704, in Clock Generation Circuit 705, in other blocks within IC 700, or may come from a source external to IC 700, coupled through one or more I/O pins. In some embodiments, Clock Generation Circuit 705 may configure a selected clock source before it is distributed throughout IC 700. Clock Generation Circuit 705 may include one or more clock sources. In some embodiments, Clock Generation Circuit 705 may include one or more of PLLs, FLLs, DLLs, internal oscillators, oscillator circuits for external crystals, etc. One or more clock output signals 912 may provide clock signals to various circuits of IC 700.

Clock Generation Circuit 705 may, in some embodiments, correspond to Clock Generation Circuit 100 in FIG. 1, or Clock Generation Circuit 100 may be included in Clock Generation Circuit 705 as one of multiple clocking circuits. Clock output signal 712 may correspond to or include output clock 121.

It is noted that the IC illustrated in FIG. 7 is merely an example. In other embodiments, a different number of circuit blocks and different configurations of circuit blocks may be possible, and may depend upon a specific application for which the IC is intended.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a plurality of flip-flop circuits connected in series, each configured to generate one of a plurality of output clock signals based on a common clock signal, wherein the plurality of flip-flop circuits includes an initial flip-flop circuit configured to receive as an input a feedback clock signal, and wherein each of the plurality of output clock signals is a different delayed version of the feedback clock signal;
   a delay circuit configured to delay a first selected clock signal of the plurality of output clock signals by a portion of a period of the common clock signal; and
   a calibration circuit configured to:
      perform a comparison of an output of the delay circuit to a second selected clock signal of the plurality of output clock signals; and
      adjust a delay time through the delay circuit based on the comparison.

2. The apparatus of claim 1, further comprising a control circuit configured to select the first and second selected clock signals, wherein the second selected clock signal corresponds to the first selected clock signal delayed by one period of the common clock signal.

3. The apparatus of claim 1, wherein the delay circuit includes a series of selectable delay elements each delay element configured to delay a respective input signal for one portion of one common clock period.

4. The apparatus of claim 3, wherein the series of selectable delay elements are further configured to delay an input signal of the delay circuit for one period of the common clock signal in response to selecting an output of a last delay element of the series as an output signal of the delay circuit.

5. The apparatus of claim 3, wherein each of the series of selectable delay elements includes a respective variable capacitor circuit, and wherein to adjust the delay time through the delay circuit, the calibration circuit is further configured to adjust at least one of the respective variable capacitor circuits.

6. The apparatus of claim 1, further comprising a calibration flip-flop circuit configured to compare the output of the delay circuit to the second selected clock signal by latching a value of the output of the delay circuit based on the second selected clock signal.

7. The apparatus of claim 1, wherein the calibration circuit is further configured to:
   modify a calibration value to adjust the delay time through the delay circuit; and
   generate a default calibration value upon an initialization.

8. A method for calibrating a delay circuit, comprising:
   generating, by a plurality of flip-flop circuits coupled to a common clock signal, a plurality of output clock signals based on a feedback clock signal, each of the plurality of output clock signals is a different delayed version of the feedback clock signal;
   delaying, by the delay circuit, propagation of a first selected clock signal of the plurality of output clock signals by a portion of a period of the common clock signal;
   comparing, by a calibration circuit, an output of the delay circuit to a second selected clock signal of the plurality of output clock signals; and
   modifying, by the calibration circuit, a calibration value based on the comparing, wherein the calibration value determines a propagation delay time of the first selected clock signal through the delay circuit.

9. The method of claim 8, further comprising generating, by the calibration circuit, a default value for the calibration value in response to determining that the delay circuit has been initialized.

10. The method of claim 9, wherein adjusting the calibration value comprises utilizing, by the calibration circuit, a binary search technique to determine a new calibration value in response to determining that the delay circuit has not been calibrated since being initialized.

11. The method of claim 8, wherein adjusting the calibration value comprises utilizing, by the calibration circuit, a sequential search technique to determine a new calibration value in response to determining that the delay circuit has previously been calibrated since being initialized.

12. The method of claim 11, further comprising delaying, by the calibration circuit, a subsequent adjustment of the calibration value in response to determining that a newest calibration value is within a range of acceptable values.

13. The method of claim 11, further comprising repeating without delay, by the calibration circuit, the sequential search technique in response to determining that a newest calibration value is outside of a range of acceptable values.

14. The method of claim 13, further comprising setting a calibration error flag in response to determining that the newest calibration value is outside of the range of acceptable values.

15. A system, comprising:
   a voltage controlled oscillator circuit configured to generate an output clock signal;
   a frequency divider circuit configured to generate a feedback clock signal with a frequency that is less than a frequency of the output clock signal; and
   a digital-to-time converter (DTC) circuit configured to:
      generate a plurality of delayed clock signals corresponding to the feedback clock signal, each delayed clock signal is a different delayed version of the feedback clock signal;
      delay a first selected clock signal of the plurality of delayed clock signals by a portion of a period of the output clock signal;
      perform a comparison of the delayed first selected clock signal to a second selected clock signal of the plurality of delayed clock signals; and
      generate a modified calibration value based on the comparison, wherein the modified calibration value determines a delay time for the delayed first selected clock signal.

16. The system of claim 15, wherein the DTC circuit is further configured to:

select one of the plurality of delayed clock signals as the first selected clock signal; and select, as the second selected clock signal, a different one of the plurality of delayed clock signals, wherein the second selected clock signal is delayed from the first selected clock signal by one period of the output clock signal.

17. The system of claim 15, wherein the DTC circuit is further configured to utilize a default value as a calibration value in response to a determination that the DTC circuit has been initialized.

18. The system of claim 15, wherein the DTC circuit is further configured to perform a binary search technique to determine a new calibration value in response to a determination that the DTC circuit has not been calibrated since being initialized.

19. The system of claim 15, wherein the DTC circuit is further configured to perform a sequential search technique to determine a new calibration value in response to a determination that the DTC circuit has previously been calibrated since being initialized.

20. The system of claim 15, wherein the DTC circuit is further configured to set a calibration error flag in response to a determination that the modified calibration value is outside of a range of acceptable values.

* * * * *